United States Patent
Cheng et al.

(10) Patent No.: US 8,482,033 B2
(45) Date of Patent: Jul. 9, 2013

(54) HIGH THROUGHPUT EPITAXIAL LIFTOFF FOR RELEASING MULTIPLE SEMICONDUCTOR DEVICE LAYERS FROM A SINGLE BASE SUBSTRATE

(75) Inventors: Cheng-Wei Cheng, White Plains, NY (US); Ning Li, White Plains, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,927

(22) Filed: Sep. 5, 2012

(65) Prior Publication Data

US 2013/0082356 A1    Apr. 4, 2013

Related U.S. Application Data

(63) Continuation of application No. 13/248,792, filed on Sep. 29, 2011.

(51) Int. Cl.
*H01I 27/14* (2006.01)

(52) U.S. Cl.
USPC ..... 257/183; 257/414; 257/425; 257/E27.122

(58) Field of Classification Search
USPC .................................. 257/414–416, 425, 183
See application file for complete search history.

(56) References Cited

U.S. PATENT DOCUMENTS

| | | | |
|---|---|---|---|
| 5,244,818 A | 9/1993 | Jokerst et al. | |
| 2007/0241417 A1* | 10/2007 | Huibers et al. | 257/436 |
| 2008/0290494 A1* | 11/2008 | Lutz et al. | 257/690 |
| 2009/0044860 A1 | 2/2009 | Pan et al. | |
| 2009/0321886 A1 | 12/2009 | Gmitter et al. | |
| 2010/0147370 A1 | 6/2010 | He et al. | |
| 2010/0240215 A1 | 9/2010 | Huang et al. | |
| 2011/0214805 A1 | 9/2011 | Brown et al. | |

OTHER PUBLICATIONS

International Search Report dated Jan. 2, 2013 received in a corresponding foreign application.

* cited by examiner

*Primary Examiner* — Thanh Nguyen
(74) *Attorney, Agent, or Firm* — Scully, Scott, Murphy & Presser, P.C.; Louis J. Percello, Esq.

(57) ABSTRACT

In one embodiment, a semiconductor structure is provided which includes a base substrate, and a multilayered stack located on the base substrate. The multilayered stack includes, from bottom to top, a first sacrificial material layer having a first thickness, a first semiconductor device layer, a second sacrificial material layer having a second thickness, and a second semiconductor device layer, wherein the first thickness is less than the second thickness.

20 Claims, 4 Drawing Sheets

HIGH THROUGHPUT EPITAXIAL LIFTOFF FOR RELEASING MULTIPLE SEMICONDUCTOR DEVICE LAYERS FROM A SINGLE BASE SUBSTRATE

CROSS REFERENCE TO RELATED APPLICATION

This application is a continuation of U.S. patent application Ser. No. 13/248,792, filed Sep. 29, 2011 the entire content and disclosure of which is incorporated herein by reference.

BACKGROUND

The present disclosure relates to semiconductor device manufacturing, and more particularly to a method of removing multiple, i.e., two or more, semiconductor device layers from an underlying base substrate.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be re-used, additional fabrication cost reduction can be achieved.

Efforts to (i) create thin-film substrates from bulk materials (i.e., semiconductors) and (ii) form thin-film device layers by removing device layers from an the underlying bulk substrates on which they were formed are ongoing.

One way to form a thin film device is to release a semiconductor device layer from a base substrate utilizing an epitaxial lift off (ELO) process. In a conventional ELO process for III-V compound semiconductor materials, an AlAs layer is inserted between an III-V compound semiconductor material and an overlying semiconductor device layer. The resultant structure is then subjected to etching in HF. After the etch, the semiconductor device layer is released from the III-V compound semiconductor material.

The conventional ELO process mentioned above can only release a single III-V compound semiconductor material after the etching. As such, the throughput of a conventional ELO process is low.

There is thus a need to provide a method which increases the yield of a conventional ELO process such that a plurality of semiconductor device layers, such as III-V compound semiconductor material layers, can be released from atop a single base substrate.

SUMMARY

The present disclosure provides a method of removing a plurality of semiconductor device layers from an underlying base substrate. In the present disclosure, a multilayered stack is formed on a base substrate. The multilayered stack includes alternating layers of sacrificial material layers and semiconductor material layers. Each successive sacrificial material layer that is formed is thicker than the previously formed sacrificial material layer. As such, the thickness of each sacrificial material layer increases upwards from the sacrificial material layer that is formed nearest to the base substrate. Because of the difference in thicknesses of the sacrificial material layers, each sacrificial material layer etches at different rates, with thicker sacrificial material layers etching faster than thinner sacrificial material layers. An etch is then performed that first removes the thickest sacrificial material layer of the multilayered stack. The uppermost semiconductor device layer within the multilayered stack is accordingly first released. As the etch continues, the other sacrificial material layers are removed sequentially, in the order of decreasing thickness, and the other semiconductor device layers are removed sequentially from top to bottom.

As such, the method of the present disclosure has increased throughput, since multiple semiconductor device layers are released from a single base substrate, as compared with a conventional ELO process in which a single semiconductor device layer is removed from a single base substrate.

In one aspect of the present disclosure, the method includes forming a multilayered stack on a base substrate. The multilayered stack includes, from bottom to top, a first sacrificial material layer having a first thickness, a first semiconductor device layer, a second sacrificial material layer having a second thickness, and a second semiconductor device layer, wherein the first thickness is less than the second thickness. Next, the first and second sacrificial material layers are selectively removed by etching. In accordance with the present disclosure, the second sacrificial material layer etches at a faster rate than the first sacrificial material layer, thereby sequentially releasing the second semiconductor device layer followed by the first semiconductor device layer.

In some embodiments, each released semiconductor device layer can be transferred to a substrate whose thermal coefficient of expansion is substantially the same as the released semiconductor device layer.

In another aspect, the method includes forming a multilayered stack on a base substrate. The multilayered stack comprises a plurality of sacrificial material layers and semiconductor device layers, wherein each semiconductor device layer within the multilayered stack is sandwiched between a lower sacrificial material layer having a first thickness and an upper sacrificial material layer having a second thickness. In accordance with the present disclosure, the first thickness is less than the second thickness. Next, each sacrificial material layer is selectively removed by etching, wherein each upper sacrificial material layer within the multilayered stack etches at a faster rate than each lower sacrificial material layer, thereby sequentially releasing each semiconductor device layer starting from an upper most semiconductor device layer to a bottom most semiconductor device layer.

In some embodiments, each released semiconductor device layer can be transferred to a substrate whose thermal coefficient of expansion is substantially the same as the released semiconductor device layer.

In yet another aspect of the present disclosure, a semiconductor structure is provided. The structure includes a base substrate, and a multilayered stack located on the base substrate. The multilayered stack includes, from bottom to top, a first sacrificial material layer having a first thickness, a first semiconductor device layer, a second sacrificial material layer having a second thickness, and a second semiconductor device layer, wherein the first thickness is less than the second thickness.

In yet a further aspect of the present disclosure, a semiconductor structure is provided. The semiconductor structure includes a multilayered stack located on a base substrate. The multilayered stack includes a plurality of sacrificial material layers and semiconductor device layers, wherein each semiconductor device layer within the multilayered stack is sandwiched between a lower sacrificial material having a first thickness and an upper sacrificial material layer having a second thickness, wherein said first thickness is less than the second thickness.

DETAILED DESCRIPTION

The present disclosure, which provides a method of releasing multiple, i.e., at least two, semiconductor device layers from an underlying base substrate, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present disclosure provides a method that improves the throughput of a conventional liftoff process. The method includes forming a multilayered stack on a base substrate. The multilayered stack includes, from bottom to top, at least a first sacrificial material layer having a first thickness, a first semiconductor device layer, a second sacrificial material layer having a second thickness, and a second semiconductor device layer, wherein the first thickness is less than the second thickness. Next, the first and second sacrificial material layers are selectively removed by etching. In accordance with the present disclosure, the second sacrificial material layer etches at a faster rate than the first sacrificial material layer, thereby sequentially releasing the second semiconductor device layer followed by the first semiconductor device layer. This aspect of the present disclosure will now be described in greater detail with reference to the following discussion and FIGS. 1-9.

Figure 1:
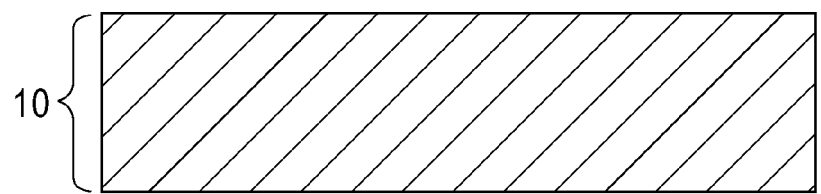
FIG. 1 is a pictorial representation (through a cross sectional view) depicting an initial structure including a base substrate that can be employed in accordance with one embodiment of the present disclosure.

Referring to FIG. 1, there is depicted an initial structure including a base substrate 10 that can be employed in accordance with one embodiment of the present disclosure. In one embodiment of the present disclosure, the base substrate 10 that can be employed comprises an III-V compound semiconductor material. The term "III-V compound semiconductor" as used throughout the present disclosure denotes a semiconductor compound that is composed of at least one element from Group III of the Periodic Table of Elements and at least one element from Group V of the Periodic Table of Elements. The III-V compound semiconductor material that can be employed as base substrate 10 may comprise a binary, i.e., two element, III-V compound semiconductor, a ternary, i.e., three element, III-V compound semiconductor or a quaternary, i.e., four element, III-V compound semiconductor. III-V compound semiconductor materials containing greater than 4 elements can also be used as base substrate 10.

Examples of III-V compound semiconductor materials that can be employed as base substrate 10 include, but are not limited to, GaAs, InP, AlAs, GaSb, GaN, InGaAs, InGaN, InGaP, AlInGaP, and AlInGaSb. In some embodiments, the base substrate 10 is composed of an III-V compound semiconductor that does not include P therein. In one embodiment of the present disclosure, the base substrate 10 is comprised of GaAs.

In another embodiment, the base substrate 10 is comprised of a Ge-containing semiconductor material. The term "Ge-containing semiconductor material" is used throughout the present disclosure to denote a semiconductor that includes Ge. The Ge-containing material may comprise pure Ge or Ge that is alloyed with another semiconductor material, such as, for example, Si. Thus, the Ge-containing semiconductor that can be employed in the present disclosure typically includes Ge in a content ranging from 1 atomic % Ge up to, and including 100 atomic % Ge. In another embodiment, the Ge-containing material that can be used as base substrate 10 is a SiGe alloy comprising from 1 atomic % Ge to 99 atomic % Ge.

The initial thickness of the base substrate 10 can vary depending on the size of the wafer employed. In one embodiment and for a 2 inch wafer, the base substrate 10 typically has an initial thickness from 200 µm to 800 µm, with an initial thickness from 300 µm to 400 µm being more typical for a 2 inch wafer. The term "initial thickness" when used in conjunction with the base substrate 10 denotes the thickness of the base substrate 10 prior to subjecting the base substrate 10 to the etching process described herein below.

The base substrate 10 that is employed in the present disclosure typically has an initial RMS surface roughness from 0.1 nm to 1 nm, within an initial RMS surface roughness from 0.2 nm to 0.5 nm being more typical. The initial RMS surface roughness is a measurement of the texture of the base substrate 10 prior to etching.

In some embodiments of the present disclosure, an optional semiconductor buffer layer (not shown) can be formed on an upper surface of the base substrate 10. As mentioned, the semiconductor buffer layer is optional. As such, and in some embodiments, the optional semiconductor buffer layer can be omitted. In other embodiments, the optional semiconductor buffer layer can be employed. For example, and in one embodiment of the present disclosure, the optional semiconductor buffer layer that can be employed is formed atop a Ge-containing semiconductor material.

The optional semiconductor buffer layer that can be employed includes a semiconductor material that differs in terms of its composition from the underlying base substrate 10. Although the optional semiconductor buffer layer is composed of a different semiconductor material than the underlying base substrate 10, the optional semiconductor buffer layer can have the same or different lattice constant as the underlying base substrate 10. The term "buffer" when used in conjunction with the term 'optional semiconductor buffer layer' denotes an intermediate layer that is located between the base substrate 10 and the multilayered structure 12 (to be subsequently formed).

The optional semiconductor buffer layer may comprise a semiconductor material including, but not limited to, Si, Ge, SiGe, SiGeC, SiC, Ge alloys, GaSb, GaP, GaAs, InAs, InP, and all other III-V or II-VI compound semiconductors. In one embodiment in which a Ge-containing material is employed as the base substrate 10, the optional semiconductor buffer layer can be composed of a III-V compound semiconductor, such as, for example, GaAs or InGaAs. In some embodiments, the optional semiconductor buffer layer is composed of an III-V compound semiconductor that does not include P therein.

In one embodiment, the semiconductor material that can be employed as the optional semiconductor buffer layer can be single crystalline. In another embodiment, the semiconductor material that can be employed as the optional semiconductor buffer layer can be polycrystalline. In yet another embodiment of the present disclosure, the semiconductor material that can be employed as the optional semiconductor buffer layer can be amorphous. Typically, the semiconductor material that can be employed as the optional semiconductor buffer layer is a single crystalline material.

The optional semiconductor buffer layer can be formed on an upper surface of the base substrate 10 utilizing techniques that are well known to those skilled in the art. In one embodiment, the optional semiconductor buffer layer can be formed atop the base substrate 10 by a physical or growth deposition process in which a semiconductor precursor is employed. In another embodiment, the optional semiconductor buffer layer can be formed by an epitaxial growth process. When an epitaxial growth process is employed, the optional semiconductor buffer layer is epitaxially aligned with the underlying surface of the base substrate 10. In yet another embodiment, the optional semiconductor buffer layer can formed atop the base substrate 10 utilizing a layer transfer process.

The thickness of the optional semiconductor buffer layer that is employed in the present disclosure can vary depending on the technique that was used in forming the same. In one embodiment, the optional semiconductor buffer layer has a thickness from 1 nm to 100 nm. In another embodiment, the optional semiconductor buffer layer has a thickness from 1 nm to 2000 nm. Other thicknesses that are above and/or below the aforementioned ranges can also be used for the optional semiconductor buffer layer.

Figure 2:
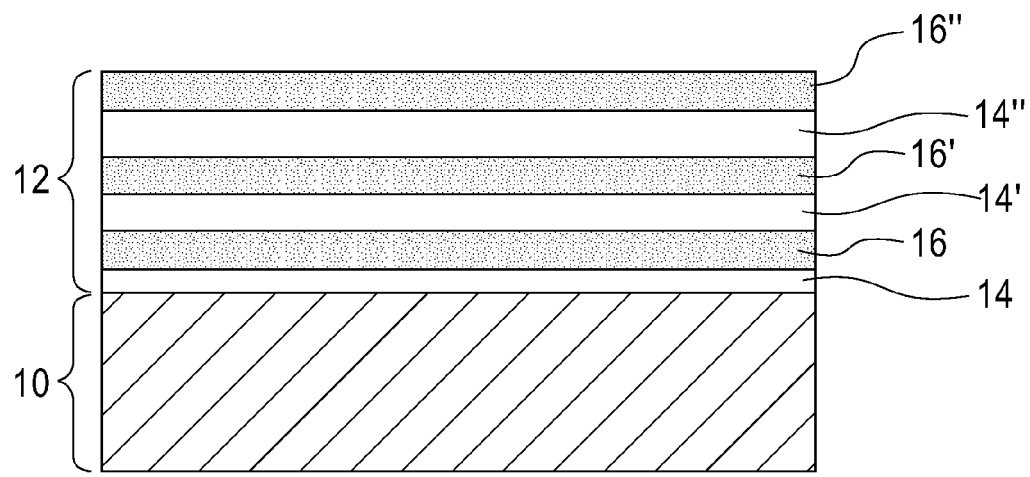
FIG. 2 is a pictorial representation (through a cross sectional view) depicting the initial structure of FIG. 1 after providing a multilayered structure that includes alternating layers of sacrificial material layers and semiconductor device layers, wherein the thickness of each sacrificial material layer increases from the bottom of the multilayered structure to the top of the multilayered structure.
Figure 3:
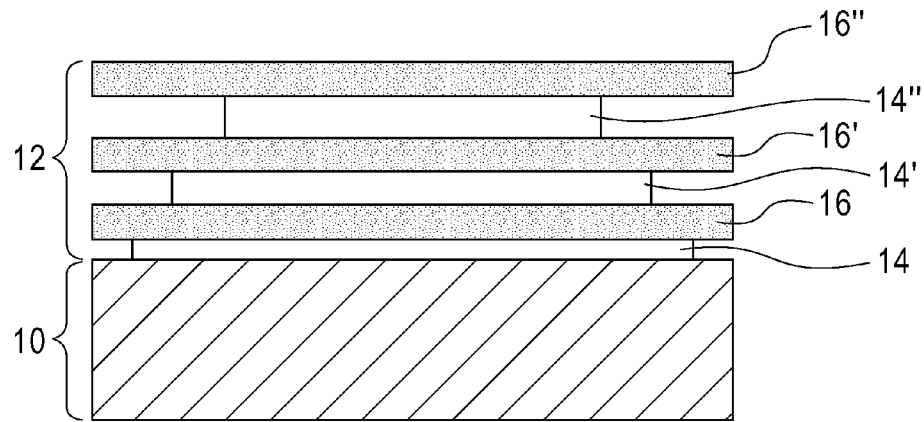
FIG. 3 is a pictorial representation (through a cross sectional view) depicting the structure of FIG. 2 during an initial stage of an etching process in accordance with the present disclosure.

Referring to FIG. 2, there is illustrated the initial structure of FIG. 1 after providing a multilayered structure 12 that includes alternating layers of sacrificial material layers 14, 14' and 14" and semiconductor device layers 16, 16' and 16", wherein the thickness of each sacrificial material layer 14, 14' and 14" increases from the bottom of the multilayered structure 12 to the top of the multilayered structure 12. Although the drawings illustrate three sacrificial material layers and three semiconductor device layers in alternating fashion, the present disclosure is not limited to that number of layers for the multilayered structure 12. Instead, the present disclosure can employ a multilayered structure 12 including n number of sacrificial material layers and m number of semiconductor device layers wherein n is equal to m, and n and m are at least 2. That is, n and m can be 2, 3, 4, 5, 6, 7, 8, etc. The upper limit for n and m is not restricted.

It is also noted that although the following drawings and description illustrate that the multilayered structure 12 is formed directly on the base substrate 10, there are some embodiments in which the multilayered structure 12 is formed on the optional semiconductor buffer layer described above. In such embodiments, an optional semiconductor buffer layer would be located between the multilayered structure 12 and the base substrate 10 shown in FIG. 2.

In one embodiment, each sacrificial material layer within the multilayered stack 12 is comprised of a different semiconductor material than each semiconductor device layer. In yet another embodiment, each sacrificial material layer within the multilayered stack 12 is comprised of a same semiconductor material as each semiconductor device layer. When the sacrificial material layers and the semiconductor device layers are comprised of a same semiconductor layer, protection layers, as will be described in greater detail herein below, are formed between each sacrificial material layer and each semiconductor device layer.

In one embodiment of the present disclosure, each sacrificial material layer (i.e., layers 14, 14' and 14") within the multilayered structure 12 comprises an III-V compound semiconductor material which may be the same or different from the III-V compound semiconductor material used as the base substrate 10, the optional buffer layer and that of each semiconductor device layer (i.e., layers 16, 16' and 16") within the multilayered structure 12. In one embodiment, and when the base substrate 10 and each semiconductor device layer (i.e., layers 16, 16' and 16") within the multilayered stack 12 are comprised of GaAs, the sacrificial III-V compound semiconductor material is composed of InAl, or AlAs.

In another embodiment, each sacrificial material layer (i.e., layers 14, 14' and 14") within the multilayered structure 12 is a sacrificial phosphide-containing layer, which may be the same or different from the material within base substrate 10, the optional buffer layer and that of each semiconductor device layer (i.e., layers 16, 16' and 16") within the multilayered structure 12. The term "sacrificial phosphide-containing layer" is used throughout the present disclosure to denote a compound of phosphorus with a less electronegative element or elements. In some embodiments, the sacrificial phosphide-containing layer has a higher content of phosphorus therein as compared with the base substrate 10, optional semiconductor buffer layer and each semiconductor device layer (i.e., layers 16, 16' and 16"). In embodiments in which the sacrificial phosphide-containing layers, the semiconductor device layers, base substrate and the optional buffer semiconductor layer are comprised of a different semiconductor material, the sacrificial phosphide-containing layers have a higher etch rate in non-HF containing etchants as compared to the other semiconductor materials and optional protection layers within the structure.

In one embodiment, the element or elements having less electronegative than phosphorus include an element from Group III and/or Group V of the Periodic Table of Elements. Illustrative materials that can be used as the sacrificial phosphide-containing layer include, but are not limited to, InAlP, InGaP, InAsP, GaAsP, InGaAlP, and InGaAsP.

In one embodiment, each sacrificial material layer (i.e., layers 14, 14' and 14") within the multilayered structure 12 can be single crystalline. In another embodiment, each sacrificial material layer (i.e., layers 14, 14' and 14") within the multilayered structure 12 can be polycrystalline. In yet another embodiment of the present disclosure, each sacrificial material layer (i.e., layers 14, 14' and 14") within the multilayered structure 12 can be amorphous. Typically, each sacrificial material layer (i.e., layers 14, 14' and 14") within the multilayered structure 12 is a single crystalline material.

Each sacrificial material layer (i.e., layers 14, 14' and 14") within the multilayered structure 12 can be formed utilizing techniques that are well known to those skilled in the art. In one embodiment, each sacrificial material layer (i.e., layers 14, 14' and 14") within the multilayered structure 12 can be formed by a physical or growth deposition process in which a semiconductor precursor is employed. In another embodiment, each sacrificial material layer (i.e., layers 14, 14' and 14") within the multilayered structure 12 can be formed by an epitaxial growth process. When an epitaxial growth process is employed, each sacrificial material layer (i.e., layers 14' and 14") within the multilayered structure 12 is epitaxially aligned with the underlying surface on which it is formed. In yet another embodiment, each sacrificial material layer (i.e., layers 14, 14' and 14") within the multilayered structure 12 can be formed by utilizing a layer transfer process.

The thickness of each sacrificial material layer (i.e., layers 14, 14' and 14") within the multilayered structure 12 increases from the bottom of the multilayered structure 12 to the top of the multilayered structure 12. Stated in other terms, each successful sacrificial material layer within the multilayered structure 12 is thicker than the previously formed sacrificial material layer. As such, the sacrificial material layer (i.e., layer 14) that is nearest to the base substrate 10 has a lesser thickness than any other sacrificial material (i.e., layers 14' and 14") layer within the multilayered structure 12, and layer 14' has a lesser thickness that layer 14". Due to this difference in thickness each of the sacrificial material layers within the multilayered structure 12 will have a different etch rate, with the thickest sacrificial material layer nearest to the top of the multilayered structure 12 having the greatest etching rate of any other sacrificial material layer within the structure.

Notwithstanding the above, and in one embodiment, each sacrificial material layer (i.e., layers 14, 14' and 14") within the multilayered structure 12 has a thickness within the range of 1 nm to 1000 nm, with the proviso that the each successive sacrificial material layer formed has a greater thickness than the previously formed sacrificial material layer. In another embodiment, each sacrificial material layer (i.e., layers 14, 14' and 14") within the multilayered structure 12 has a thickness within a range from 10 nm to 100 nm, with the proviso that the each successive sacrificial material layer formed has a greater thickness than the previously formed sacrificial material layer. Other thicknesses that are above and/or below the aforementioned ranges can also be used for the each sacrificial material layer 14, with the proviso that the each successive sacrificial material layer formed has a greater thickness than the previously formed sacrificial material layer.

Each semiconductor device layer (i.e., layers 16, 16' and 16") within the multilayered structure 12 can include a same or different semiconductor material such as, but are not limited to, Si, Ge, SiGe, SiGeC, SiC, Ge alloys, GaSb, GaP, GaAs, InAs, InP, and all other III-V or II-VI compound semiconductors. In some embodiments, at least one semiconductor device layer within the multilayered structure 12 is composed of an III-V compound semiconductor. In some embodiments, at least one semiconductor device layer within the multilayered structure 12 is comprised of an III-V compound semiconductor that does not include P therein.

In some embodiments, at least one of semiconductor device layers within the multilayered structure 12 is a bulk semiconductor material. In other embodiments, at least one of the semiconductor device layers within the multilayered structure 12 may comprise a layered semiconductor material such as, for example, a semiconductor-on-insulator or a semiconductor on a polymeric substrate. Illustrated examples of semiconductor-on-insulator substrates that can be employed as a semiconductor device layer include silicon-on-insulators and silicon-germanium-on-insulators.

In some embodiments, each semiconductor device layer comprises a same semiconductor material as that of the base substrate 10. In another embodiment, each semiconductor device layer and the base substrate 10 comprise different semiconductor materials. The semiconductor material of each semiconductor device layer can be doped, undoped or contain doped regions and undoped regions.

In one embodiment, the semiconductor material that can be employed as a semiconductor device layer can be single crystalline. In another embodiment, the semiconductor material that can be employed as a semiconductor device layer can be polycrystalline. In yet another embodiment of the present disclosure, the semiconductor material that can be employed as a semiconductor device layer can be amorphous. Typically, the semiconductor material that can be employed as each of the semiconductor device layers is a single crystalline material.

Each semiconductor device layer (i.e. layers 16, 16' and 16") can be formed utilizing techniques that are well known to those skilled in the art. In one embodiment, each semiconductor device layer (i.e., layers 16, 16' and 16") can be formed by a physical or growth deposition process in which a semiconductor precursor is employed. In another embodiment, each semiconductor device layer (i.e., layers 16, 16' and 16") can be formed by an epitaxial growth process. When an epitaxial growth process is employed, the semiconductor device layer is epitaxially aligned with the underlying surface of the sacrificial material layer that it is formed thereon. In yet another embodiment, each semiconductor device layer (i.e., layers 16, 16' and 16") can be formed atop a sacrificial material layer utilizing a layer transfer process. In some embodiments, a combination of the aforementioned techniques can be employed in forming the semiconductor device layers within the multilayered structure 12.

Each semiconductor device layer within the multilayered structure 12 can be processed to include at least one semiconductor device including, but not limited to, a transistor, a capacitor, a diode, a BiCMOS, a resistor, a component of photovoltaic cell, a component of a solar cell, etc. In one embodiment, the at least one semiconductor device can be formed on at least one of the semiconductor device layers after formation of the at least one semiconductor device layer onto the sacrificial material layer. In another embodiment, the at least one semiconductor device can be formed prior to forming the at least one semiconductor device layer on the sacrificial material layer. In yet another embodiment, a combination of the above mentioned techniques can be employed.

The thickness of each semiconductor device layer that is employed in the present disclosure can vary depending on the type of device that is to be presented thereon. In one embodiment, each semiconductor device layer has a thickness within a range from 3 nm to 1000 nm. In another embodiment, each semiconductor device layer has a thickness within a range from 5 nm to 100 nm. Other thicknesses that are above and/or below the aforementioned ranges can also be used for each semiconductor device layer.

Referring now to FIGS. 3, 4, 6 and 8, there are illustrated the structure of FIG. 2 during an initial stage of an etching process (FIG. 3), and after various stages of the etching process (FIGS. 4, 6 and 8) in accordance with the present disclosure. In one embodiment, the etching process is performed utilizing an HF containing etchant. This embodiment of the present disclosure can be employed when the sacrificial material layers are other than a sacrificial phosphide-containing material as described above. In another embodiment, the etching process is performed utilizing a non-HF containing etchant. This embodiment is employed when the sacrificial material layers are comprised of a sacrificial phosphide-containing material as described above.

When an HF containing etchant is employed, the HF containing etchant includes HF and optionally water. That is, the HF containing etchant may be used neat, or HF may be diluted with water to provide a dilute HF containing etchant. The concentration of the HF that can be employed in the present disclosure to remove the sacrificial material layers from the structures can range from 1% to 99%. Other concentrations can be used so long as the concentration of the HF containing etchant does not adversely effect the selectively of the HF containing etchant for etching the sacrificial material layers.

When a non-HF containing etchant is employed, any non-HF etchant that selectively etches sacrificial phosphide-containing layers relative to the other semiconductor layers and optional protection layers that are present in the structure can be employed. In some embodiments and as mentioned above, the sacrificial phosphide-containing layers that can be used in the multilayered stack 12 as layers 14, 14' and 14" have a higher etch rate in the non-HF etchant as compared to the base substrate 10, the optional semiconductor buffer layer and each semiconductor device layers (i.e., layers 16, 16' and 16"). In addition and in this embodiment of the present disclosure, the etch that is employed includes any non-HF etchant that is capable of dissolving the etched reaction product such that no etched reaction product forms on the surface of underlying material during the etch. Stated in other terms, the non-HF etchant employed in this embodiment of the present disclosure reacts with the sacrificial phosphide-containing layers and forms "highly" soluble reaction products which do not stay on the underlying semiconductor material layers. For example, an InAlP sacrificial phosphide-containing layer reacts with HCl to form $InCl_3$, $AlCl_3$, and $PH_3$, as reaction products. $PH_3$ is a gaseous product and it can diffuse from the reaction front immediately and $InCl_3$ and $AlCl_3$ are highly soluble to the etchant employed in the present disclosure.

The non-HF etchant that can be employed in the present disclosure to remove the sacrificial phosphide-containing layers from the structure includes any non-HF containing acid that (i) selectively etches the sacrificial phosphide-containing layers relative to the other semiconductor layers (i.e., layers 10 and 16, 16' and 16") and optional protection layers that are present in the structures, and (ii) that dissolves the etched reaction product such that no etched reaction product forms on the surface of underlying semiconductor materials.

Examples of non-HF containing acids that can be employed in the present disclosure include, but are not limited to, HCl, HBr, HI and mixtures thereof. The non-HF containing acid(s) may be used neat, or they may be diluted with water to provide a dilute non-HF containing acid or dilute non-HF containing acid mixture. The concentration of the non-HF containing acid that can be employed in the present disclosure to remove the sacrificial phosphide-containing layers from the structures can range from 1% to 99%. Other concentrations can be used so long as the concentration of the non-HF containing acid does not adversely effect (i) the selectively of the non-HF containing acid for etching the sacrificial material layers and (ii) the ability of the non-HF containing acid to dissolve the etched reaction product such that no etched reaction product forms on the surface of the underlying semiconductor materials. A higher concentration of non-HF etchant is preferred to keep the surface atomically smooth of the base substrate 10 after the etch due to the passivation effect.

In one embodiment, and notwithstanding the type of etchant employed, the etch used to remove each of the sacrificial material layers from the structure can be performed at room temperature (i.e., from 20° C.-40° C.). In another embodiment, the etch used to remove each of the sacrificial material layers from the structure can be performed at an elevated temperature that is greater than room temperature up to, but not beyond, the boiling point of the type of etchant employed. In one example, the elevated temperature can be from greater than 40° C. up to 100° C.

The etching process can be performed utilizing techniques well known to those skilled in the art including, for example, dipping an edge portion of the structure into a bath containing an HF containing etchant of non-HF etchant, immersing the entire structure into a bath containing an HF containing etchant or a non-HF etchant, spraying the HF containing etchant or non-HF etchant onto an edge portion of the structure, or brushing coating the HF containing or non-HF containing etchant onto an edge portion. Any combination of these techniques can also be used to etch the sacrificial material layers from the structure.

The duration of the each etching step employed in the present disclosure may vary depending on the type of etchant employed, the conditions that the etch was performed and the length of the initial base substrate 10 employed. In one embodiment, the duration of each etch is typically from 1 hour to 7 days, with a duration of each etch from 1 hour to 1 day being more typical. Each may be performed for a longer or shorter duration than the ranges mentioned above depending on the size of the wafer and the technique applied during the etch.

As mentioned above, the sacrificial material layers that are thicker etch faster than the other sacrificial material layers that are present within the multilayered structure. As such, and as shown, the sacrificial material layer 14" is etched faster than the sacrificial material layer 14', which etches faster than the sacrificial material layer 14. During the various stages of etching, the various semiconductor device layers would release sequentially from top to bottom. In the particular embodiment that is illustrated in the drawings of the present disclosure, semiconductor device layer 16" would release first (see FIG. 4), followed by semiconductor device layer 16' (see FIG. 6), followed by semiconductor device layer 16 (See FIG. 8).

Figure 4:
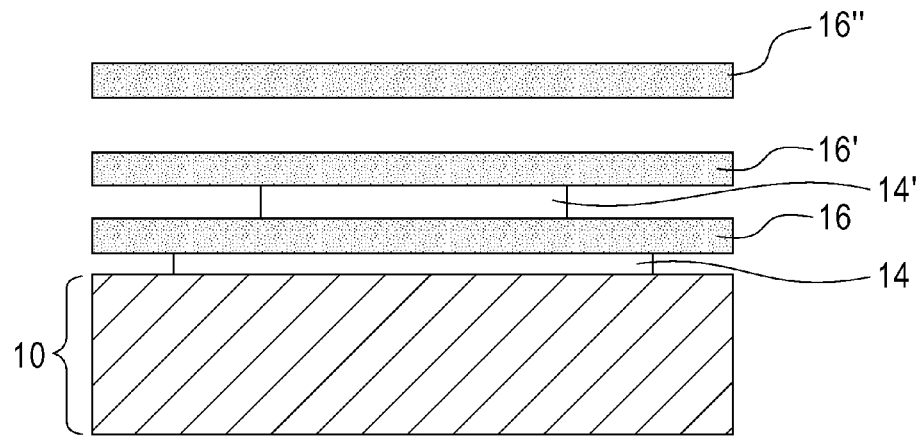
FIG. 4 is a pictorial representation (through a cross sectional view) depicting the structure of FIG. 3 during another stage of the etching process in accordance with the present disclosure.
Figure 5:
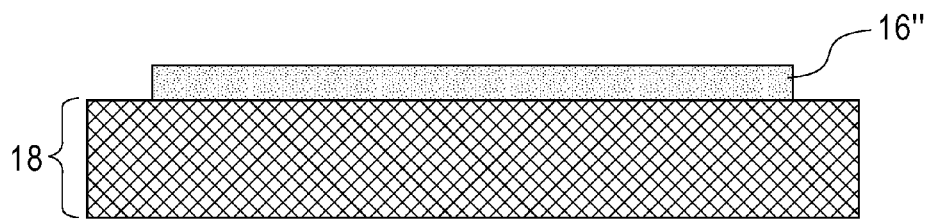
FIG. 5 is a pictorial representation (through a cross sectional view) depicting the transferring of a removed semiconductor device layer from the structure shown in FIG. 4 to a substrate whose thermal expansion coefficient is substantially the same as the removed semiconductor device layer.
Figure 6:
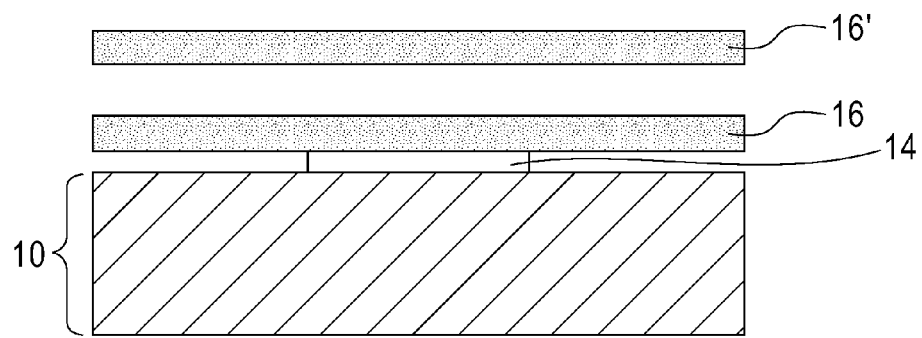
FIG. 6 is a pictorial representation (through a cross sectional view) depicting a portion of the structure of FIG. 4 during yet another stage of the etching process in accordance with the present disclosure.
Figure 7:
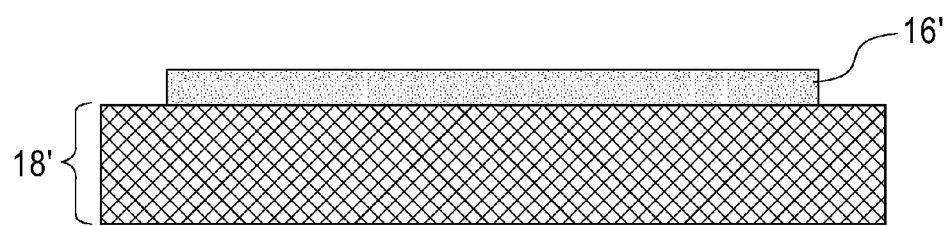
FIG. 7 is a pictorial representation (through a cross sectional view) depicting the transferring of another removed semiconductor device layer from the structure shown in FIG. 6 to another substrate whose thermal expansion coefficient is substantially the same as the another removed semiconductor device layer.
Figure 8:
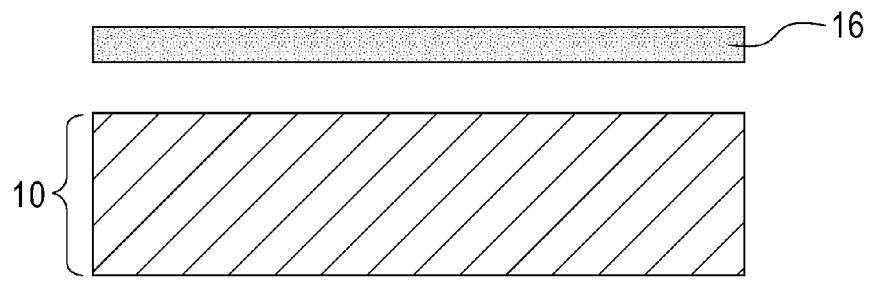
FIG. 8 is a pictorial representation (through a cross sectional view) depicting a portion of the structure of FIG. 6 during yet another stage of the etching process in accordance with the present disclosure.
Figure 9:
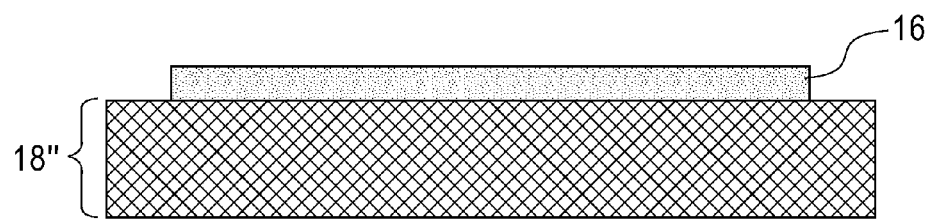
FIG. 9 is a pictorial representation (through a cross sectional view) depicting the transferring of yet another removed semiconductor device layer from the structure shown in FIG. 8 to yet another substrate whose thermal expansion coefficient is substantially the same as the yet another removed semiconductor device layer.

In the embodiment illustrated in FIGS. 4, 6 and 8, the released semiconductor device layers 16, 16' and 16" can be used as is, or they can be disposed atop a substrate whose thermal expansion coefficient is substantially the same as the yet another removed semiconductor device layer. Reference is made to FIGS. 5, 7, and 9 which illustrate the released semiconductor device layer (i.e., layers 16, 16' and 16") being deposed on a substrate (i.e., elements 18, 18' and 18") whose thermal expansion coefficient is substantially the same as the yet another removed semiconductor device layer. Examples of substrates whose thermal expansion coefficient is substantially the same as the yet another removed semiconductor device layer include, but are not limited to, a glass substrate, a Si wafer, a III-V compound semiconductor wafer, and a steel plate. The transfer of the released semiconductor device layers to the substrate can be performed utilizing a conventional layer transfer process.

With respect to the 'released' base substrate 10 shown in FIG. 8, the 'released' base substrate 10 can be re-used. In some embodiments in which an HF containing etchant is employed further treatment such as chemical mechanical polishing are required to be performed prior to re-using the base substrate. In another embodiment in which a non-HF containing etchant is employed, the 'released' base substrate 10 can be re-used without any further treatments. In such an embodiment, the surface roughness of the 'released' base substrate 10 is essentially the same, within ±0.5 nm, as that of the initial surface roughness of the base substrate 10. Also, and in the embodiment in which a non-HF containing etchant is employed the thickness of the 'released' base substrate is essentially the same, within ±100 nm, as that of the initial thickness of the base substrate 10 prior to performing the etch.

Figure 10:
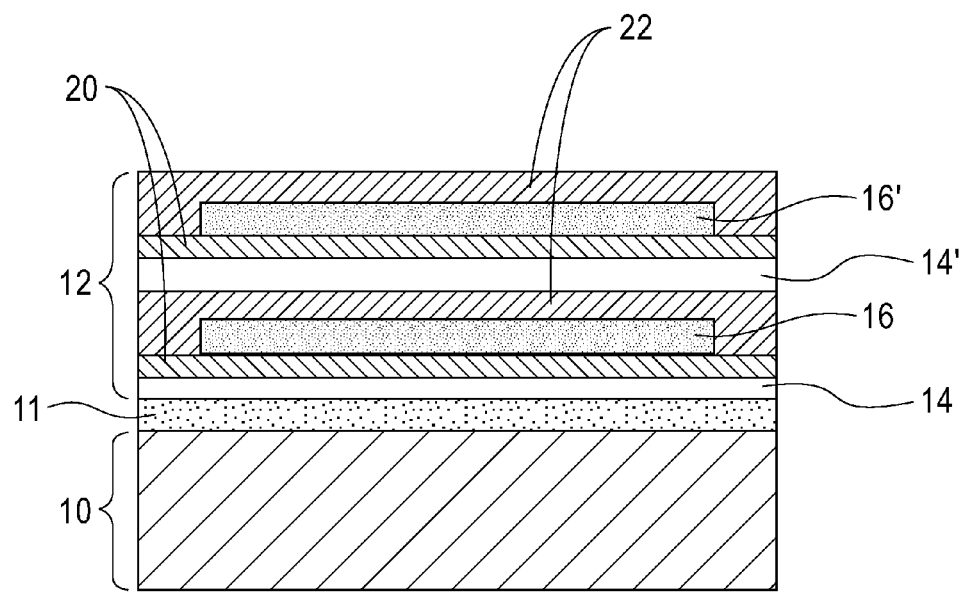
FIG. 10 is a pictorial representation (through a cross sectional view) depicting another structure that can be employed in the present disclosure including protection layers encasing each of the various semiconductor device layers within a multilayered structure.

Reference is now made to FIG. 10 which illustrates another structure that can be employed in the present disclosure. This structure includes base substrate 10, an optional semiconductor buffer layer 11, and a multilayered stack 12 including a first sacrificial material layer 14 having a first thickness, a first semiconductor device layer 16, a second sacrificial material layer 14' having a second thickness, and a second semiconductor device layer 16'. As shown, the first thickness is less than the second thickness. In this embodiment, the sacrificial material layers and the semiconductor device layers are comprised of a same semiconductor material. As also shown, each of the semiconductor device layers is patterned by lithography and etching. In some embodiments, the patterning step can be omitted and the second protection layer is formed on an upper surface and sidewall edges of each of the semiconductor device layers shown in FIG. 10. For example, each of the semiconductor device layers 16 and 16' and each of the sacrificial material layers 14 and 14' may include a phosphide-containing material and they have the same etching rates.

In such an embodiment and as shown in FIG. 10, a first protection layer 20 is formed between each sacrificial material layer and each semiconductor device layer within the multilayered stack 12 to prevent the semiconductor device layers from being etched. Each first protection layer 20 employed can be GaAs or other non-phosphide-containing materials which are not etched by the etchant. Each first protection layer 20 can be formed by conventional techniques such as, for example, thermal growth or deposition. A second protection layer 22 is formed atop exposed surfaces (top and sidewalls) of each semiconductor device layer to prevent the semiconductor device layers from being etched by the etchant. Each second protection layer 22 could be $SiO_2$, $Si_3N_4$ or other materials which are not etched by the etchant. Each second protection layer 22 can be formed utilizing conventional techniques that are well known to those skilled in the art including thermal growth or deposition. The structure shown in FIG. 10 can then be processed as mentioned above to release each semiconductor device layer from the structure. After removing a semiconductor device layer, an etch can be used to remove at least the second protection layer 22 from the structure. The same etch or another etch could be used to remove the underlying first protection layer 20. In some embodiments, the first protection layer 20 can remain beneath the released semiconductor device layer.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a base substrate; and
   a multilayered stack on a base substrate, said multilayered stack comprising, from bottom to top, a first sacrificial material layer having a first thickness, a first semiconductor device layer, a second sacrificial material layer having a second thickness, and a second semiconductor device layer, wherein the first thickness is less than the second thickness, and wherein said first and second sacrificial material layers are comprised of a same semiconductor material as the first and second semiconductor device layers and wherein a first protection layer is formed beneath each semiconductor device layer, and wherein a second protection layer is formed on exposed surfaces of each semiconductor device layer.

2. The semiconductor structure of claim 1, wherein said base substrate comprises an III-V compound semiconductor material.

3. The semiconductor structure of claim 1, wherein said base substrate has an initial root mean square (RMS) surface roughness from 0.1 nm to 1 nm.

4. The semiconductor structure of claim 1, wherein said base substrate comprises a Ge-containing semiconductor material, and wherein a semiconductor buffer layer is located between the Ge-containing semiconductor material and said multilayered structure.

5. The semiconductor structure of claim 4, wherein said Ge-containing semiconductor material is pure germanium.

6. The semiconductor structure of claim 4, wherein said Ge-containing semiconductor material comprises germanium alloyed with another semiconductor atom.

7. The semiconductor structure of claim 6, wherein said Ge-containing semiconductor material comprises from 1 atomic % to 99 atomic % germanium.

8. The semiconductor structure of claim 6, wherein said another semiconductor atom comprises silicon.

9. The semiconductor structure of claim 4, wherein said semiconductor buffer layer is single crystalline.

10. The semiconductor structure of claim 4, wherein said semiconductor buffer layer is a III-V semiconductor compound.

11. A semiconductor structure comprising:
a multilayered stack located on a base substrate, said multilayered stack comprising a plurality of sacrificial material layers and semiconductor device layers, wherein each semiconductor device layer within the multilayered stack is sandwiched between a lower sacrificial material having a first thickness and an upper sacrificial material layer having a second thickness, wherein said first thickness is less than the second thickness, and wherein each sacrificial material layer of said plurality of sacrificial material layers is comprised of a same semiconductor material as each semiconductor device layer of said plurality of semiconductor device layers and wherein a first protection layer is formed beneath each semiconductor device layer, and wherein a second protection layer is formed on exposed surfaces of each semiconductor device layer.

12. The semiconductor structure of claim 11, wherein said base substrate comprises an III-V compound semiconductor material.

13. The semiconductor structure of claim 11, wherein said base substrate comprises a Ge-containing semiconductor material, and wherein a semiconductor buffer layer is located between the Ge-containing semiconductor material and said multilayered structure.

14. The semiconductor structure of claim 13, wherein said Ge-containing semiconductor material is pure germanium.

15. The semiconductor structure of claim 13, wherein said Ge-containing semiconductor material comprises germanium alloyed with another semiconductor atom.

16. The semiconductor structure of claim 15, wherein said Ge-containing semiconductor material comprises from 1 atomic % to 99 atomic % germanium.

17. The semiconductor structure of claim 15, wherein said another semiconductor atom comprises silicon.

18. The semiconductor structure of claim 13, wherein said semiconductor buffer layer is single crystalline.

19. The semiconductor structure of claim 13, wherein said semiconductor buffer layer is a III-V semiconductor compound.

20. The semiconductor structure of claim 11, wherein said base substrate has an initial root mean square (RMS) surface roughness from 0.1 nm to 1 nm.

* * * * *